US009739859B2

(12) United States Patent
Bachschmidt et al.

(10) Patent No.: US 9,739,859 B2
(45) Date of Patent: Aug. 22, 2017

(54) METHOD AND CONTROL DEVICE TO CONTROL A MAGNETIC RESONANCE SYSTEM

(71) Applicants: Theresa Bachschmidt, Nuremberg (DE); Hans-Peter Fautz, Forchheim (DE); Rene Gumbrecht, Herzogenaurach (DE); Dominik Paul, Bubenreuth (DE)

(72) Inventors: Theresa Bachschmidt, Nuremberg (DE); Hans-Peter Fautz, Forchheim (DE); Rene Gumbrecht, Herzogenaurach (DE); Dominik Paul, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 1014 days.

(21) Appl. No.: 14/026,291

(22) Filed: Sep. 13, 2013

(65) Prior Publication Data
US 2014/0077802 A1    Mar. 20, 2014

(30) Foreign Application Priority Data
Sep. 14, 2012  (DE) .................. 10 2012 216 353

(51) Int. Cl.
*G01R 33/48* (2006.01)
*G01R 33/483* (2006.01)

(52) U.S. Cl.
CPC ...... *G01R 33/4828* (2013.01); *G01R 33/4833* (2013.01)

(58) Field of Classification Search
CPC .................. G01R 33/4828; G01R 33/4833
See application file for complete search history.

(56) References Cited

U.S. PATENT DOCUMENTS

| 4,878,499 A | 11/1989 | Suzuki et al. |
| 5,254,949 A | 10/1993 | McDonald et al. |
| 5,500,593 A | 3/1996 | Loncar et al. |

(Continued)

OTHER PUBLICATIONS

Park et al.: "Gradient Reversal Technique and Its Application to Chemical-Shift-Related NMR Imaging", Magnetic Resonance in Medicine, vol. 4 (1987) pp. 526-536.

(Continued)

*Primary Examiner* — Dixomara Vargas
(74) *Attorney, Agent, or Firm* — Schiff Hardin LLP

(57) ABSTRACT

A method and control device operate a magnetic resonance system in order to execute a first pulse sequence that includes an excitation phase and an acquisition phase. In the excitation phase, a first gradient is applied in a gradient direction to generate a spatially dependent basic magnetic field. A selective radio-frequency excitation pulse is executed, wherein the selective radio-frequency excitation pulse excites a first material and does not excite a second material in a first partial region of an examination volume, and wherein the selective radio-frequency excitation pulse does not excite the first material and excites the second material in a second partial region of the examination volume. In the acquisition phase, non-selective refocusing pulses are executed in order to acquire raw data of the first and second partial region of the examination volume, which acquisition is spatially coded along the gradient direction.

12 Claims, 6 Drawing Sheets

(56) References Cited

U.S. PATENT DOCUMENTS

| | | | | |
|---|---|---|---|---|
| 6,094,591 A | * | 7/2000 | Foltz | A61B 5/145 |
| | | | | 324/306 |
| 6,498,485 B2 | | 12/2002 | Miyosi et al. | |
| 8,228,060 B2 | * | 7/2012 | Busse | A61B 5/055 |
| | | | | 324/307 |
| 8,862,202 B2 | * | 10/2014 | Alexander | A61B 5/1114 |
| | | | | 600/410 |

OTHER PUBLICATIONS

Takahara et al.: "Fat suppression with Slice-Selection Gradient Reversal (SSGR) revisited", Proc. Intl. Mag. Reson. Med., vol. 17 (2009) p. 2642.

Tang et al.: "Interleaved Water and Fat Imaging and Applications to Lipid Quantitation Using the Gradient Reversal Technique", Journal of Magnetic Resonance Imaging, vol. 26 (2007) pp. 1064-1070.

Yu et al.; "Implementation and Noise Analysis of Chemical Shift Correction for Fast Spin Echo Dixon Imaging", Proc. Intl. Soc. Mag. Reson. Med., vol. 11 (2004) p. 2686.

\* cited by examiner

METHOD AND CONTROL DEVICE TO CONTROL A MAGNETIC RESONANCE SYSTEM

BACKGROUND OF THE INVENTION

Field of the Invention

The present invention concerns a method and a control device to control a magnetic resonance system to execute a pulse sequence. The invention also concerns a magnetic resonance tomography system, also called a magnetic resonance system in the following.

Description of the Prior Art

Magnetic resonance tomography—also called nuclear magnetic resonance tomography—is a widespread technique to acquire images of the inside of the body of a living examination subject.

Atomic nuclei, for example of hydrogen atoms, exhibit a property known as a spin, which is a quantum mechanical property of atomic particles. The spin has the effect that the atomic particles are magnetic dipoles, meaning that an atomic nuclei with spin are magnetic dipoles. These spins initially act in any direction. They can be considered as a vector. Atoms with spin are present in a body to be examined, for example a human body.

In a magnetic resonance tomography system, the body to be examined is typically exposed to a relatively high basic field magnet field $B_0$ (for example of 1, 5, 3 or 7 Tesla) with the use of a basic field magnet system. The force effect of the static magnetic field $B_0$ generates a preferred direction of the spins parallel and antiparallel to the field lines. An excess always forms in one direction, which leads to a macroscopic magnetization of the spin ensemble.

A radio-frequency magnetic field $B_1$ is superimposed on the static magnetic field $B_0$. This radio-frequency magnetic field (which normally is generated by radio-frequency excitation pulses) brings the spins out of the steady state generated by the $B_0$ field when the radio-frequency excitation signals are in resonance with the precession frequency of the spins. The precession frequency is also called Larmor frequency. It is dependent on the strength of the external magnetic field. By means of the radio-frequency excitation signals, the nuclear spins of the atoms excited to resonance by this radio-frequency field are flipped by a defined flip angle relative to the magnetic field lines of the basic magnetic field.

The emission of the radio-frequency signals for nuclear resonance magnetization most often takes place by means of what is known as a "whole-body coil" or "body coil". A typical design of a whole-body coil is a cage antenna (birdcage antenna) which comprises multiple transmission rods that—running parallel to the longitudinal axis—are arranged around a patient space of the tomograph in which a patient is located in the examination. The antenna rods are respectively capacitively connected with one another in an annular form on their front sides. However, currently local coils close to the body are being used more often for the emission of MR excitation signals. The reception of magnetic resonance signals normally takes place with the local coils, but in some cases also alternatively or additionally with the body coil.

A gradient is applied along a gradient direction via gradient coils. The magnetic field $B_0$ thereby increases linearly. The precession of the nuclear spins along the gradient direction is accordingly different; the spins spin slower here, faster there. They therefore show resonance at different frequencies. A spatially selective excitation of the nuclear spins is possible via the superimposed gradient field.

The exciting radio-frequency signal or the exciting radio-frequency pulse receives a defined bandwidth of neighboring frequencies around a center frequency. In this way a desired region along the gradient direction can be excited.

In nearly all molecules, multiple hydrogen atoms are bound at various positions. Various positions mean different chemical (and therefore most often also different magnetic) environments. The local magnetic field is hereby reduced or, respectively, increased; the resonance frequencies of the bound protons are somewhat lower or higher than the typical Larmor frequency.

The nuclear spins in the body tissue thus do not have a uniform precession frequency in the magnetic field, but rather differ according to their chemical environment for different tissue types. This is typically designated as a chemical shift. Fat has multiple peaks in the spectrum, but one is strongly pronounced and delivers a high signal for imaging. The chemical shift between the primary peak of the adipose tissue and water is approximately 3.5 ppm, for example.

After an excitation, the nuclear spins flip back again into their initial state that is enforced by the basic magnetic field. This is what is known as the relaxation of the nuclear spins. It is differentiated in longitudinal relaxation and transversal relaxation. The longitudinal relaxation describes the re-establishment of the magnetization along the magnetic field lines of the basic magnetic field $B_0$. The transversal relaxation describes the disappearance of the magnetization caused by the radio-frequency field $B_1$ transversal to the magnetic field lines of the basic magnetic field $B_0$. Different tissues have different relaxation times.

In the precession, radio-frequency signals (what are known as magnetic resonance signals) are radiated that are received and processed further by means of suitable reception antennas. The desired image data are reconstructed from the raw data acquired in such a manner. The reception antennas can either be the same antennas with which the radio-frequency excitation pulses are also radiated or separate reception antennas.

As used herein, the term "fat signal" means the signal that a nuclear spin that is situated in adipose tissue emits upon relaxation. The term "water signal" means the signal that a nuclear spin that is located in an aqueous region emits upon relaxation.

The signals emitted in the precession and received by the reception antennas must be capable of spatial association in order to enable an imaging. For this, a spatial coding is implemented in the acquisition of the signals via coding gradients.

Given 2D magnetic resonance pulse sequences, a spatial coding takes place in two directions or dimensions. Therefore, image information or raw data are respectively read out for a very thin slice. The slice is selected beforehand. Given 3D magnetic resonance pulse sequences, a spatial coding takes place in three directions or dimensions. Therefore, image information or raw data are respectively read out for an entire volume, what is known as a "slab".

The raw data are written into a matrix in an electronic memory known as k-space. K-space is a space or a spatial frequency domain that is Fourier-transformed into a positional space that includes the subject magnetization. The axes of k-space designate what are known as spatial frequencies. K-space has a unit that is inverse to the distance, for example 1/cm. In 3D tomography, k-space is also three-dimensional.

Static magnetic field differences contribute to a diversification of the spins upon relaxation. With spin echo sequences, this diversification is canceled via a refocusing pulse or, respectively, via a series of refocusing pulses. If multiple refocusing pulses (normally 180° pulses) follow in series, multiple spin echoes arise, generated by a multi-echo sequence. The registration in k-space depends on the desired contrast, among other things. Often the earlier echoes—i.e. the echoes with a smaller position number—are initially registered in central k-space.

SPACE (Sampling Perfection with Application optimized Contrast using different flip angle Evolutions) is an example of a three-dimensional turbo spin echo sequence method—more precisely a single slab 3D turbo spin echo method—that can have very long echo trains. For example, a long echo time includes between forty and multiple hundreds of echoes; thousands of echoes are also possible, for instance. For a "provided signal development" (prescribed signal evolution), the flip angle of the refocusing pulses in an echo train is adapted to the properties (T1 and T2) of the different tissue types. A variable flip angle curve (flip angle evolution) is obtained. A desired signal strength is generated for different types of tissue. For example, a desired contrast can therefore be generated.

The magnetic resonance images of the examination subject are ultimately created on the basis of the received magnetic resonance signals. Each image point in the magnetic resonance image is thereby associated with a small physical volume—what is known as a "voxel"—and each brightness or intensity value of the image points is linked with the signal amplitude of the magnetic resonance signal that is received from this voxel. The connection between a resonant, radiated RF pulse with field strength $B_1$ and the flip angle $\alpha$ that is therefore achieved is thereby provided by the equation $$\alpha = \int_{t=0}^{\tau} \gamma \cdot B_1(t) \cdot dt, \qquad (1)$$

wherein $\gamma$ is the gyromagnetic ratio—which for most magnetic resonance examinations can be viewed as a fixed material constant—and $\tau$ is the effective duration of the radio-frequency pulse.

In many cases the very bright fat signal, which in many cases outshines the water signal of primary interest, is problematic in the diagnosis of possible pathologies.

Therefore, possibilities have already been proposed to suppress the fat signal. For example, before the actual measurement a frequency-selective pulse is emitted at the precession frequency of the protons situated in adipose tissue so that their spins are saturated and do not contribute to the signal in the subsequent image acquisition.

A further possibility is offered by what is known as the Dixon sequence, in which multiple echoes are acquired at different echo times (time after an excitation or, respectively, refocusing pulse). The image data of different materials (thus for example fat and water) are shifted in their phase. It is a post-processing measure, meaning that the acquired raw data are retroactively processed. Such a Dixon sequence is, for example, described in H. Yu et al.: "Implementation and Noise Analysis of Chemical Shift Correction for Fast Spin Echo Dixon Imaging" in Proc. Intl. Soc. Mag. Reson. Med. 11 (2004), 2686, wherein a Dixon sequence is used in the method described there in order to achieve a correction of the chemical shift within an image plane via multiplication of the k-space lines with a defined phase term.

However, the methods that have previously been known have disadvantages in regions with strong B1 inhomogeneities: conventional fat saturation methods are based on the fact that the predetermined flip angle is achieved as exactly as possible. At high basic field strengths (B0≥3T), this is often not the case. Since the proposed method foregoes pre-pulses and inversion pulses, this is less susceptible to B1 inhomogeneities. Known methods are also limited in the image resolution that can be achieved: under the circumstances, the desired resolution cannot be achieved in Dixon TSE due to timing problems of the individual echoes in the echo train. Confusion can also occur in the separation of fat and water in the DIXON method, such that the fat image incorrectly shows a water image and vice versa.

SUMMARY OF THE INVENTION

An object of the present invention is to provide a method that is usable in three-dimensional magnetic resonance tomography and a corresponding control device to control a magnetic resonance system, with which the fat signal can be cleanly separated from the water signal.

The method according to the invention includes an excitation phase and an acquisition phase. In the excitation phase, a first gradient is applied in a gradient direction to generate a spatially dependent basic magnetic field. A selective, radio-frequency excitation pulse is executed, wherein the selective, radio-frequency excitation pulse excites a first material and does not excite a second material due to the chemical shift in a first partial region of an examination volume. The selective, radio-frequency excitation pulse excites the first material and does not excite the second material in a second partial region. In the acquisition phase, a number of refocusing pulses (i.e. at least one, but advantageously more) are executed in order to acquire spatially coded raw data of the first and second partial region of the examination volume along the gradient direction. Refocusing pulses can generally be selective or non-selective.

In principle, the method according to the invention is applicable given arbitrary materials that exhibit a chemical shift relative to one another, for example given measurements of specific metabolites. However, the main problem in most clinical examinations is—as already explained above—the high signal of the fat portion relative to the typically excited water, such that the method is advantageously applied given the materials water and fat. This means that water or fat is to be understood as the first and second materials in the sense of the invention (with "first" and "second" being arbitrarily applied). In the following, these materials are therefore always used as an example without limiting the invention to these.

In a known manner, the gradient applied in a gradient direction has the effect that the Larmor frequency of the nuclear spins varies along the gradient. The executed selective, radio-frequency excitation pulse will therefore only excite nuclear spins in a certain region, and in fact in the region in which the nuclear spins (i.e. their Larmor frequency) are in resonance with the frequency of the excitation pulse. The bandwidth of the excitation pulse thereby determines the thickness of the excited region.

Due to the chemical shift between the first material and second material, in particular the chemical shift between water and fat, regions that are somewhat shifted counter to one another are excited for water and for fat. The selective, radio-frequency excitation pulse is now chosen so that the first material (water, for example) is excited in a first partial region and the second material (fat, for example) is not excited in said first partial region. The first material is not excited and the second material is excited in a second partial region (which is different than the first partial region).

In the acquisition phase, a spatial coding is implemented along the gradient direction. The partial region in which the first material is excited is thus acquired with spatial coding and the second partial region in which the second material is excited is acquired with spatial coding. The acquisition of the two partial regions takes place in the same acquisition phase. Or, in other words, the acquisition phase is common to both partial regions. In the acquisition phase, an acquisition occurs of raw data that are generated in a first partial region (for example only of the material water) and in the second partial region (of only the material fat). Without further separation of water signal and fat signal in post-processing, an image acquisition takes place that shows pure water signals in a first partial region without interfering fat signals being superimposed. In a second region, the image acquisition generates pure fat signals without water signals being present.

The method according to the invention thus provides a possibility to specifically excite only water or only fat, and to specifically acquire these regions with spatial coding. A subsequent data processing to separate the signals of different materials is not required.

A deliberate selection of the bandwidth of the excitation pulse is required for this. The bandwidth must thereby be adapted to the gradients. It is thus ensured that a clean separation into a first partial region and a second partial region is possible. Narrowband pulses are normally required for this. For example, given a bandwidth of an excitation RF pulse of 1 kHz, the fat signal is shifted by approximately 0.63 mm relative to the water signal at a field strength of 1.5 Tesla. At 3 Tesla, this shift doubles relative to the 1.5 Tesla magnetic field, meaning that it is then 1.26 mm. At 7 Tesla, the distance is already 2.98 mm.

A control device according to the invention for controlling a magnetic resonance system must comprise a RF transmission antenna system, a gradient system and an RF reception antenna system for implementation of the method. The control device must be designed so that it controls a gradient system in order to apply a first gradient along a gradient direction to generate a spatially dependent basic magnetic field. The control device must control the RF transmission antenna system in order to execute a selective, radio-frequency excitation pulse. The selective, radio-frequency excitation pulse must thereby excite a first material and not excite a second material in a first partial region of the examination volume. The control device also controls the RF transmission antenna system so that a number of refocusing pulses is executed for spatially coded acquisition of raw data along the gradient direction.

Aside from the typical components, a magnetic resonance tomography system according to the invention requires a control device equipped according to the invention.

A majority of the previously cited components of the control device can be realized entirely or partially in the form of software modules in a processor of a corresponding control device. This is inasmuch advantageous since already present control devices can also be retrofitted via a software installation for the implementation of the method according to the invention. The invention therefore also includes a computer program product which can be loaded directly into a processor of a programmable control device of a medical imaging system, with program code means in order to execute all steps of the method according to the invention when the program is executed in the control device.

In a preferred exemplary embodiment, at least one of the refocusing pulses is non-selective. All refocusing pulses can also be non-selective, or some can be non-selective and others can be selective.

In a preferred exemplary embodiment, the acquisition of raw data takes place three-dimensionally with spatial coding. A pulse sequence therefore generates data for a three-dimensional volume, also called a "slab". The first and second partial region also therefore represent volumes. Slice images can be placed through these volumes later. It is possible to view slice images in the first partial region that, for example, originate only from a water signal, and to have only slice images that were generated from a fat signal displayed in the second partial region.

In a further development, the spatial coding can take place in a first dimension and in a second dimension in the form of a phase coding, and in a third dimension in the form of a frequency coding, but also in a phase coding.

A phase coding can take place along the gradient direction.

The spatially dependent basic magnetic field is preferably adjusted via the gradient so that the resonance frequencies of the nuclear spins in the first material in the first partial region of the examination volume lie between a first frequency and a second frequency, and such that the resonance frequencies of the nuclear spins in the second material in the second partial region of the examination volume lie between the first frequency and the second frequency. The same excitation frequency is thus required for the first material in the first partial region as for the nuclear spins in the second material in the second partial region of the examination volume. Therefore, the first material in the first partial region and the second material in the second partial region can be specifically excited with one excitation pulse.

In a version of this embodiment, a frequency spectrum of the selective radio-frequency excitation pulse lies between the first and second frequency. If the frequency spectrum extends precisely from the first frequency to the second frequency, the first material is excited in the entire first partial region and the second material is excited in the complete second partial region. The two excited regions then adjoin one another.

It is also conceivable that the radio-frequency excitation pulse has a somewhat narrower band with its spectrum. An intermediate region in which no excitation takes place then remains between the first partial region and the second partial region. Because the acquisition takes place with spatial coding along the gradient direction, this allows a cleaner separation of the partial regions. Slice images that are produced in the one partial region or in the other partial region are unambiguously associated with a water excitation or a fat excitation.

In an embodiment, the method according to the invention includes a first pulse sequence and a second pulse sequence. The second pulse sequence includes an excitation phase with a second gradient to generate a spatially dependent basic magnetic field. The second gradient differs from the first gradient in the algebraic sign. The same selective radio-frequency excitation pulse is executed. The reversal of the second gradient in relationship to the first gradient has the consequence that the second material is excited and the first material is not excited given the excitation of the selective radio-frequency excitation pulse in the first partial region of the examination volume. The selective radio-frequency excitation pulse, which does not differ from the first pulse sequence in the second pulse sequence, accordingly excites the first material and does not excite the second material in the second partial region.

The method developed in such a manner leads to image data of the same examination volume, wherein in the first image data set the image signals originate from the first material in the first partial region and originate from the second material in the second partial region. In a second data set (generated by the second pulse sequence), the image signals originate from the second material in the first partial region and originate from the first material in the second partial region. It is then possible to display only water signals from the entire examination volume and only fat signals from the entire examination volume if the two data sets are combined with one another.

In an alternative development of the method, a second pulse sequence is likewise executed. While the gradient in the excitation phase does not differ from the gradient of the first pulse sequence, the selective radio-frequency excitation pulse is executed with a frequency shift. This frequency offset has the effect that now material is no longer excited in a first partial region in which the first material was excited with the first pulse sequence. For this, the first material is excited in a second partial region of the examination volume. Given a corresponding frequency shift in the other direction, no material can be excited in the second partial region of the examination volume and only the second material can be excited in the first partial region. The two pulse sequences therefore lead to the generation of a pure water signal image in the entire examination volume, or selectively to the generation of a pure fat signal image in the entire examination volume. If both water signal images and fat signal images are desired for the entire examination volume, a third pulse sequence must be executed that likewise has a frequency shift, but in the other direction.

DESCRIPTION OF THE PREFERRED EMBODIMENTS

In the following, the invention will be described with reference to a 3D magnetic resonance pulse sequence since its application is particularly advantageous.

Figure 1:
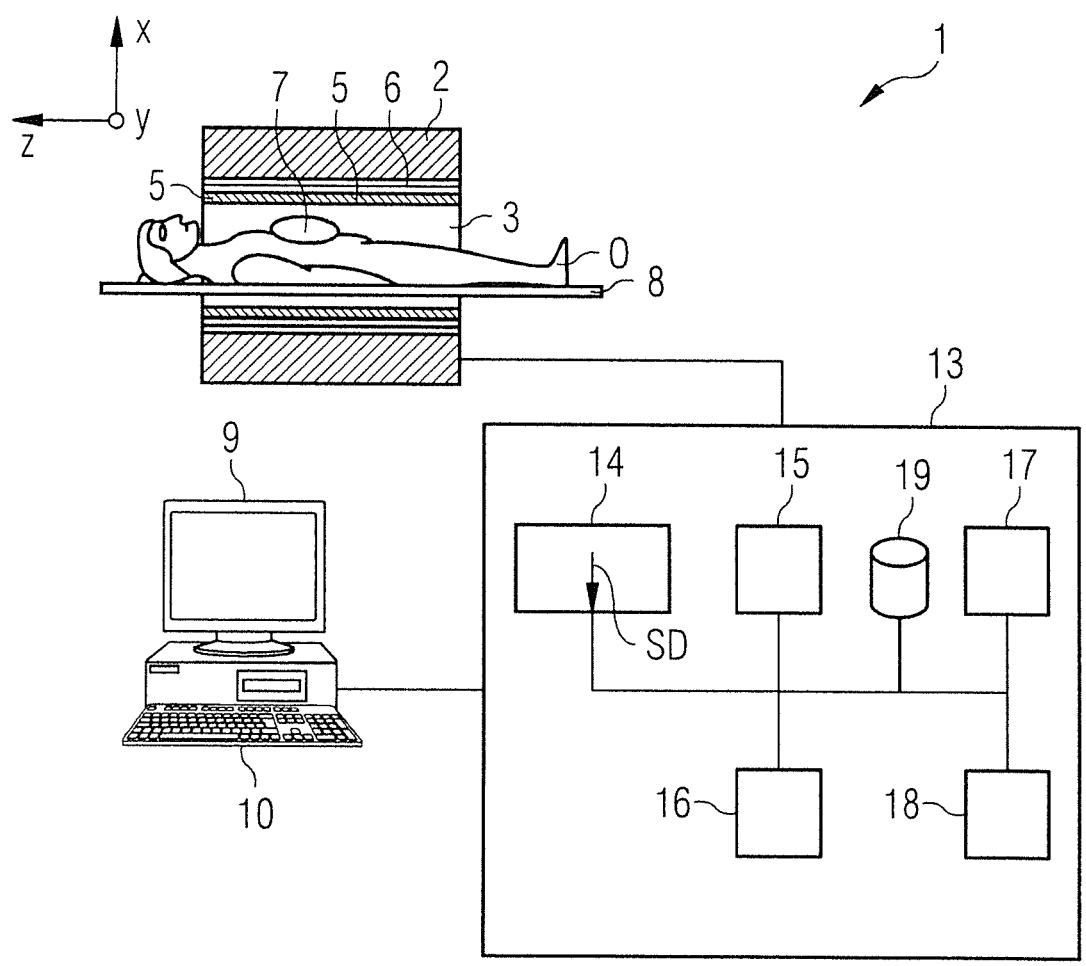
FIG. 1 schematically illustrates a magnetic resonance system according to an exemplary embodiment of the invention.

A magnetic resonance tomography system 1 (shortened to "magnetic resonance system" in the following) is presented in a roughly schematic form in FIG. 1. Both two-dimensional and three-dimensional raw data acquisitions can normally be conducted with a magnetic resonance system as shown in FIG. 1. The magnetic resonance system 1 on the one hand comprises the actual magnetic resonance scanner 2 with an examination space 3 or patient tunnel into which an examination subject O or here a patient or test subject (in whose body the examination subject—a defined organ, for example—is located) on a bed 8 can be driven.

The magnetic resonance scanner 2 is typically equipped with a basic field magnet system, a gradient system 6 and an RF transmission antenna system 5 and an RF reception antenna system 7. In the shown exemplary embodiment, the RF transmission antenna system 5 is a whole-body coil permanently installed in the magnetic resonance scanner 2, in contrast to which the RF reception antenna system 7 comprises local coils (symbolized by only a single local coil in FIG. 2) to be arranged on the patient or examination subject. However, the whole-body coil can in principle also be used as an RF reception antenna system and the local coils can be used as an RF transmission antenna system insofar as these coils can respectively be switched into different operating modes. The basic field magnet system is typically fashioned so that it generates a basic magnetic field in the longitudinal direction of the patient, i.e. along the longitudinal axis of the magnetic resonance scanner 2 that travels in the z-direction. The gradient system 6 typically comprises individually controllable gradient coils in order to be able to switch gradients in the x-, y- or z-direction independently of one another.

The magnetic resonance system shown in FIG. 1 is a whole-body system with a patient tunnel into which a patient can be completely introduced. In principle, however, the invention can also be used at other magnetic resonance systems (for example with laterally open, C-shaped housing), but also in particular with smaller magnetic resonance scanners in which only one body part can be positioned, for example.

The magnetic resonance system 1 furthermore has a central control device 13 that is used to control the magnetic resonance system 1. This central control device 13 comprises a sequence control unit 14 for measurement sequence control. The sequence of radio-frequency excitation pulses (RF pulses) and gradient pulses is controlled with this. The design of the control device—normally the design of a computer program product that runs in the control device—decides the type of image acquisition.

To radiate the individual RF pulses, the central control device 13 has a radio-frequency transmission device 15 that generates and amplifies the excitation pulses and feeds said excitation pulses into the RF transmission antenna system 5 via a suitable interface (not shown in detail). To control the gradient coils of the gradient system 6, the control device 13 has a gradient system interface 16. The sequence control unit 14 communicates in a suitable manner with the radio-frequency transmission device 15 and the gradient system interface 16, for example via emission of sequence control data SD. The control device 13 also has a radio-frequency reception device 17 (likewise communicating in a suitable manner with the sequence control unit 14) in order to acquire magnetic resonance signals (i.e. raw data) received by the RF reception antenna system 7.

A reconstruction unit 18 receives the acquired raw data and reconstructs magnetic resonance image data from these. These image data can then be stored in a memory 19, for example.

An operation of the central control device 13 can take place via a terminal with an input unit 10 and a display unit 9, via which terminal the entire magnetic resonance system 1 can thus also be operated by an operator. MR images can also be displayed at the display unit 9, and measurements can be planned and started by means of the input unit 10 (possibly in combination with the display unit 9).

The magnetic resonance system 1, and in particular the control device 13, can moreover have a plurality of additional components (not shown in detail here but typical to such systems), for example a network interface in order to connect the entire system with a network and allow the exchange of raw data and/or image data or, respectively, parameter maps, but also additional data (for example patient-relevant data or control protocols).

How suitable raw data are acquired via a radiation of RF pulses and the generation of gradient fields, and how MR images can be reconstructed from these, is known in principle to the man skilled in the art and is not explained in detail here.

Figure 2:
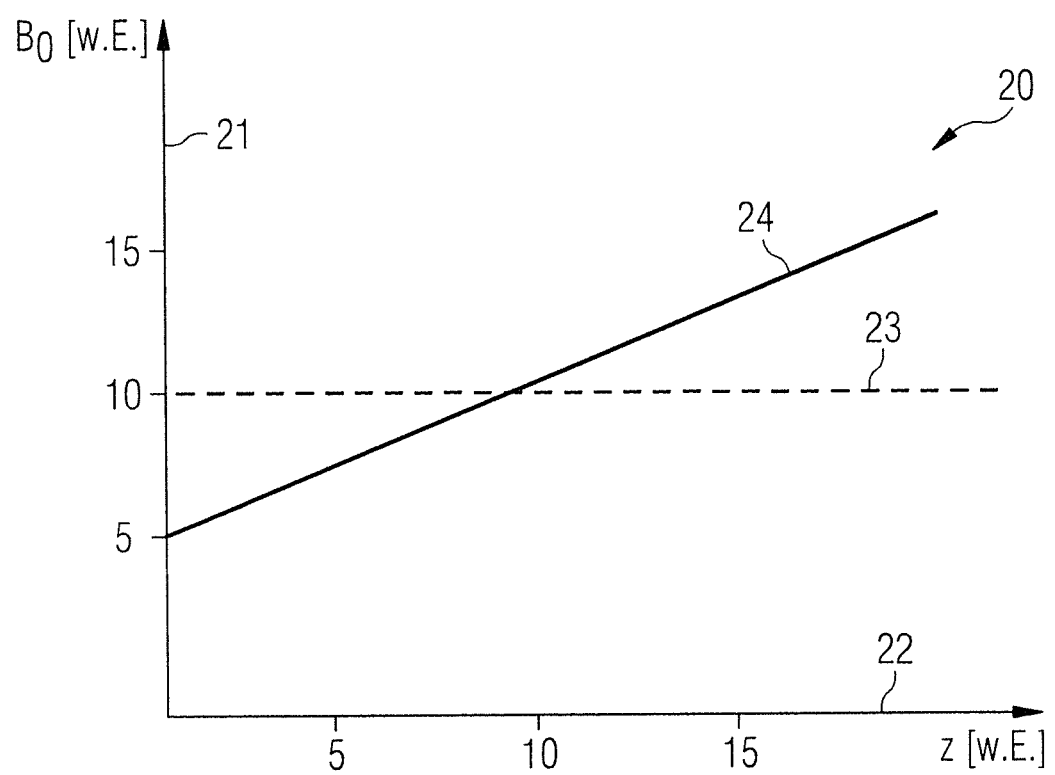
FIG. 2 is a diagram to illustrate the effect of a gradient field.

FIG. 2 shows a diagram 20 in which the basic magnetic field strength $B_0$ (Axis 21) generated by the basic field magnet system is plotted over the longitudinal axis z (Axis 22). The axes 21 and 22 are labeled in arbitrary units. A dashed line 23 indicates a homogeneous basic magnetic field with a magnetic field strength 10 in arbitrary units. For example, in general this field strength is 1.5 Tesla, 3 Tesla or 7 Tesla. Other values are possible.

A solid line 24 shows how the basic magnetic field varies due to an applied gradient field. The basic magnetic field strength $B_0$ changes linearly over the longitudinal axis z. In a random example, it is 5 arbitrary units at a location 0 on the z-axis and 10 arbitrary units at a location 10 on the z-axis.

The precession frequency or Larmor frequency of the nuclear spins coincides with the basic magnetic field via Equation (2)

$$\omega = \gamma \cdot B_0 \qquad (2)$$

wherein $\gamma$ designates the gyromagnetic ratio that is a constant. For instance, $\gamma = 42.58$ MHz/T applies to the normally excited hydrogen nuclei. Due to the chemical shift explained above, the hydrogen nuclei have a somewhat different Larmor frequency at the same basic magnetic field strength depending on their chemical environment.

Using FIG. 3, it is explained in the following how the spatially different precession frequencies that are produced by the basic magnetic field and the gradient field are utilized according to the invention for a specific, spatially separated excitation.

Figure 3:
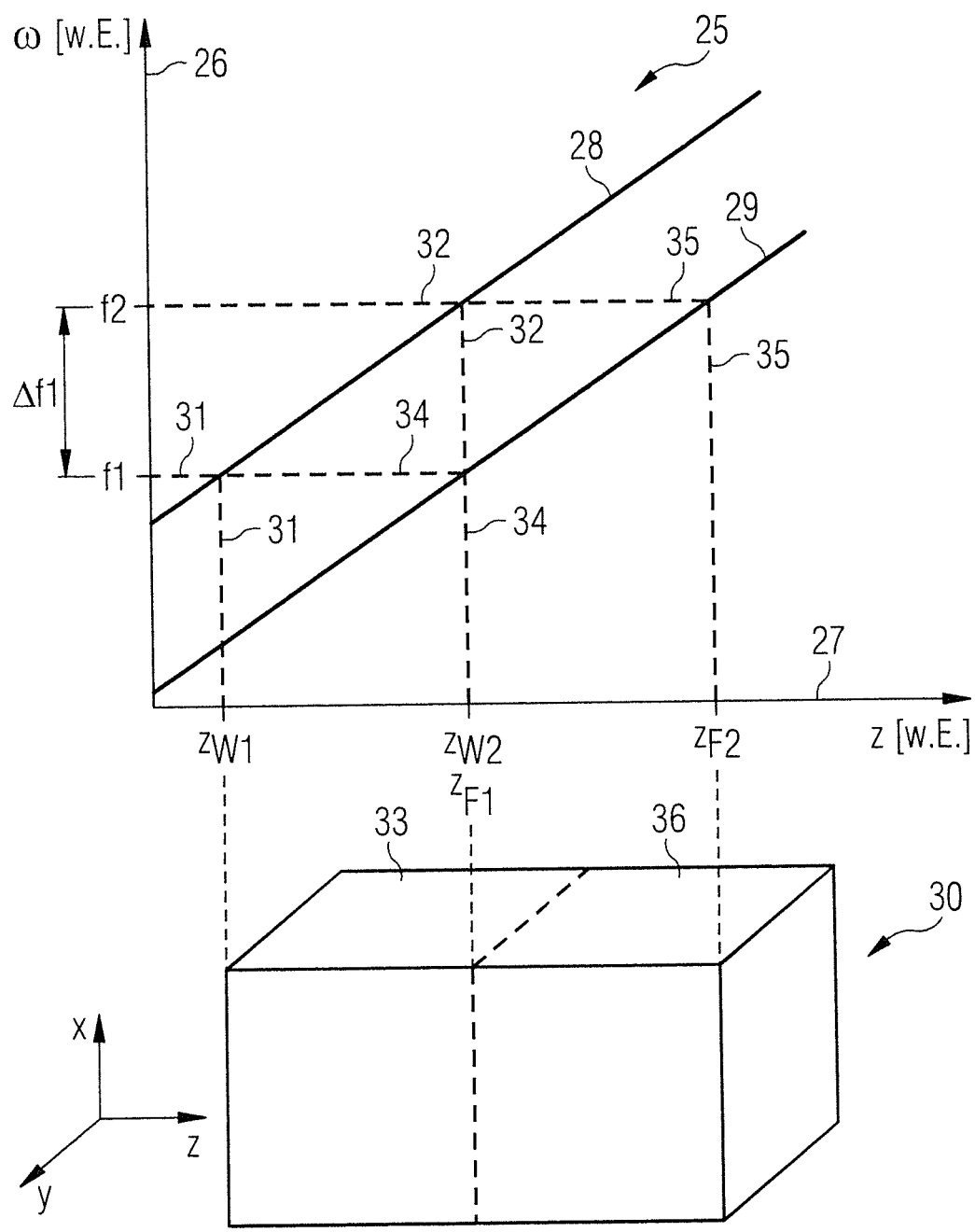
FIG. 3 schematically shows the excitation phase according to the invention for the separate excitation in two partial regions of an examination volume.

FIG. 3 shows a diagram 25 in which the precession frequency $\omega$ is plotted on an axis 26 over the longitudinal axis z (Axis 27). It is thereby to be heeded that the z-axis in FIG. 3 (just as in the following FIGS. 4 and 5) must not correspond to the z-axis indicated in FIG. 1. Magnetic resonance tomography allows examined slices to be oriented arbitrarily. A basic magnetic field with an applied gradient field (as shown in FIG. 2) is assumed. A straight line 28 then shows a correlation according to Equation (2) between a location along the z-axis and a precession frequency for protons (hydrogen nuclei) that are located in an aqueous environment. These protons are designated in the following as "water protons". A straight line 29 accordingly shows a correlation between a position along the z-axis and a precession frequency for protons (hydrogen nuclei) that are located in fat. These protons are designated in the following as "fat protons". Due to the chemical shift, the straight line 29 is shifted in parallel towards lower frequencies relative to the straight line 28. Arbitrary units have been selected for both axes; the presentation is not to scale.

Shown under the diagram 25 in FIG. 3 is an examination volume 30 whose z-axis corresponds to the z-axis of diagram 25. The examination volume is presented as a cuboid; however, it can also have a different spatial shape. The examination volume is a "slab". One application can be the acquisition of a human joint, for example a knee joint.

An excitation pulse is executed in an excitation phase. The spectrum of the excitation pulse is chosen so that it lies between a frequency f1 and a frequency f2 and has a bandwidth $\Delta f1 = f2 - f1$, as indicated on the axis 26. Only protons whose precession frequency is in resonance with a frequency of the excitation pulse are excited. A dashed line 31 indicates which z-coordinate on the straight line 28 is associated with the frequency f1 due to the basic magnetic field and the gradient field. Water protons are excited at the z-coordinate $z_{W1}$ with the frequency f1. A dashed line 32 accordingly indicates that water protons at the z-coordinate $z_{W2}$ are excited with the frequency f2. The excitation pulse therefore excites water protons in a partial region 33 of the examination volume 30. The excitation pulse is selective in the z-direction.

Due to the chemical shift, fat protons at the z-coordinate $z_{F1}$ are excited with the frequency f1, as a dashed line 34 indicates. The coordinate $z_{F1}$ corresponds to the $z_{W2}$ in the shown example. A dashed line 35 correspondingly indicates that fat protons are excited at the z-coordinate $z_{F2}$ with the frequency f2. The excitation pulse therefore excites fat protons in a partial region 36 of the examination volume 30.

In the partial region 33, the fat protons are not in resonance; they are not excited. In the partial region 36, the water protons are not in resonance; they are not excited. In the example shown in FIG. 3, the partial regions 33 and 36 directly adjoin one another.

Figure 4:
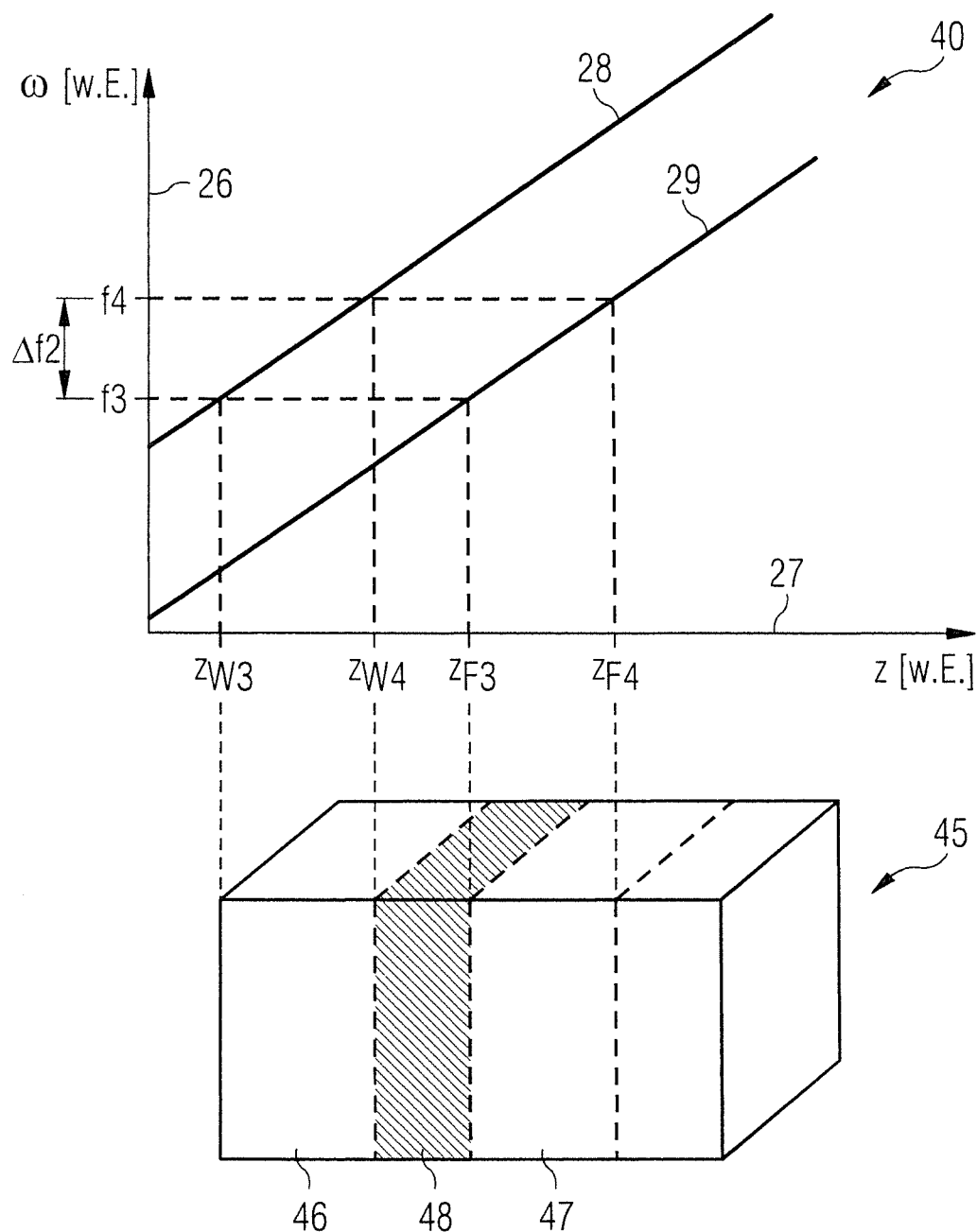
FIG. 4 schematically shows the excitation phase according to the invention for the separate excitation in two partial regions of an examination volume, with modified excitation pulse.

FIG. 4 shows a further example of an excitation phase with another excitation pulse given the same applied basic magnetic field and the same gradient field. The representation corresponds to that of FIG. 3 and need not be explained further.

The spectrum of the excitation pulse is selected so that it lies between a frequency f3 and a frequency f4 and has a bandwidth $\Delta f2 = f4 - f3$ that is smaller than the bandwidth $\Delta f1$. The excitation pulse excites water protons and not fat protons in a partial region 47, and excites fat protons and not water protons in a partial region 47. A shaded partial region 48 lies between the partial region 46 and the partial region 47. Neither water protons nor fat protons are excited in the partial region 48. Via the selection of a very narrow-band excitation pulse, the partial regions 46 and 47 do not touch.

In addition to the change of the bandwidth of the excitation pulse, an adaptation of the excited regions can also still take place by changing other parameters. The spatial shift between fat and water is proportional to the chemical shift, the magnetic field strength of the static field (for example 1.5 T, 3 T or 7 T), the excited slab width and the inverse bandwidth of the excitation pulse. In 3D imaging, the slab width is thereby defined as the volume dimension in the z-direction. It comprises the product of the number of slices and slice widths plus possible intervals between the individual slices. z-direction is thereby not necessarily used as a real spatial direction in which the basic magnetic field lies, as in FIG. 1; rather, the coordinate system is rotated accordingly. It corresponds to a convention that the slice dimension/slab direction is always called z. If water should be separated exactly from fat, the spatial shift must be as large as the excited slab. Orders of magnitude for the bandwidth of the excitation pulse are approximately 220 Hz at 1.5 T, approximately 440 Hz at 3 T. For example, the excitation pulse that is typical in a SPACE sequence has a bandwidth of approximately 2 kHz.

The necessary gradient Gz is computed via $$Gz = 2 \cdot \tau \cdot \Delta f / (\gamma \cdot z_{ang})$$

wherein $z_{ang}$ is thereby the width of the excited slab.

The steepness of the gradient can thus also be varied in order to achieve a change of the spatial excitation.

An acquisition phase follows the excitation phase described above. Refocusing pulses—for example non-selective refocusing pulses—are executed in a known manner; a multi-echo sequence is created. The echoes are received by the radio-frequency antennas. In order to be able to spatially associate the received echoes, they are spatially coded via gradient fields in the acquisition phase. A spatial coding—for example a phase coding along the z-axis, i.e. along the gradient direction which was also used in the excitation phase—allows the spatially coded acquisition of raw data of the first partial region and second partial region of the examination volume. A SPACE sequence is used in the exemplary embodiment. This 3D method uses a frequency coding in one direction and a respective phase coding in the two other directions. A phase coding for the spatial information takes place along the z-axis.

In the acquisition phase, the raw data are written into k-space. The image data are computed from the raw data in a known manner. Three-dimensional image data for the entire examination volume are subsequently available. Arbitrary slices can be placed through the examination volume for evaluation. Due to the separate excitation, these slice images show pure "water signal images" within the first partial regions 33 and 46 without interference due to bright fat signals. Within the partial regions 36 or, respectively, 47, these slice images show pure "fat signal images".

Figure 5:
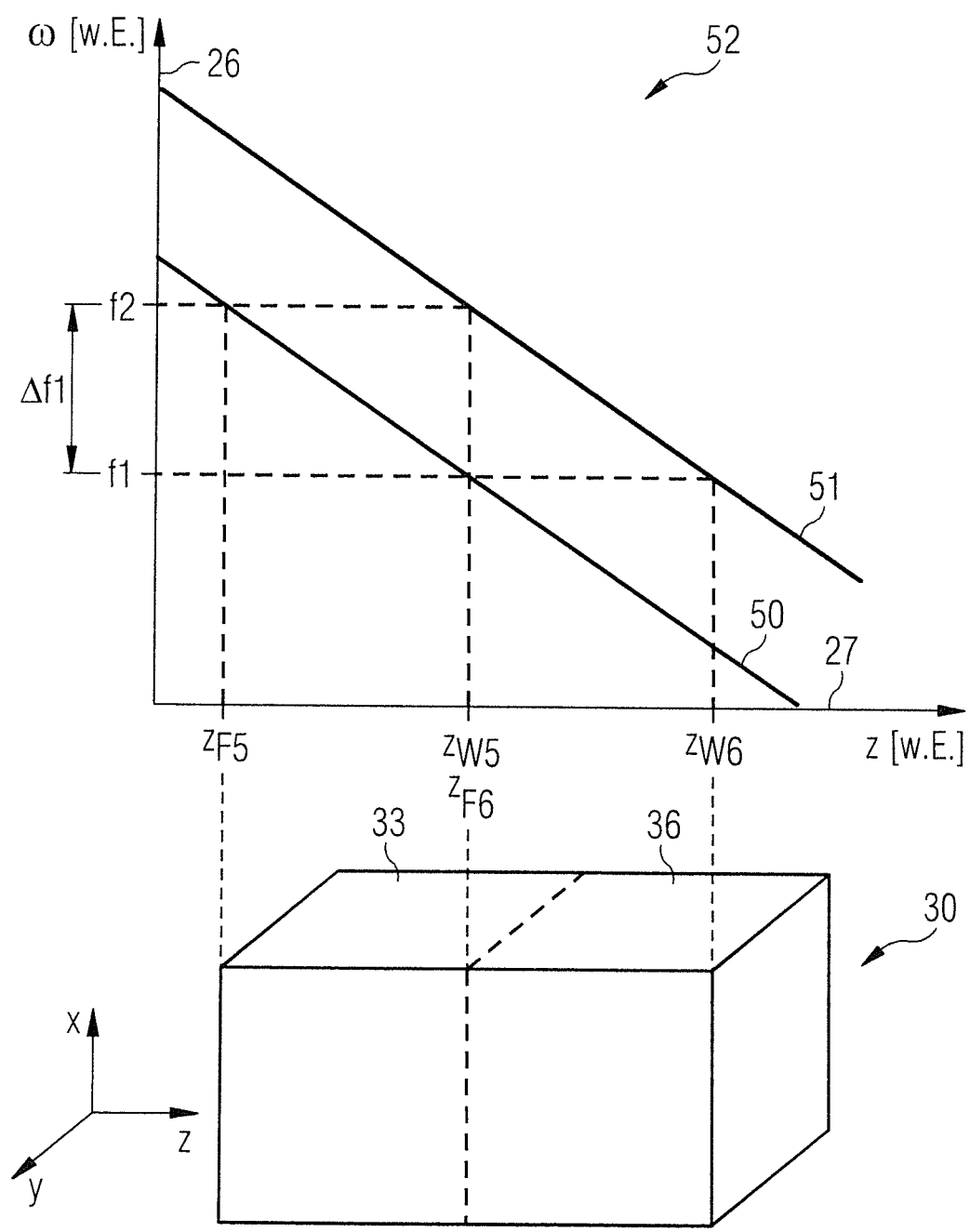
FIG. 5 schematically shows the excitation phase according to the invention for the separate excitation in two partial regions of an examination volume, with modified gradient field.

In order to also be able to produce pure "water signal images" in the second partial region, the first magnetic resonance tomography acquisition can be followed by a second, as is explained using FIG. 5.

FIG. 5 shows a diagram 52 that essentially corresponds to the diagram 25 in FIG. 3. The axes 26 and 27 are likewise identical to the frequencies f1 and f2, which bound the spectrum of the excitation pulse with the bandwidth $\Delta f1$. The examination volume 30 with partial regions 33 and 26 is also the same as in FIG. 3. After an excitation as it is shown in FIG. 3, with following acquisition, an excitation follows according to FIG. 5, wherein the gradient field has a reverse algebraic sign. This means that, where the basic magnetic field was previously increased by the gradient field, it is now lowered, and vice versa.

A straight line 51 accordingly shows a correlation according to Equation (2) between a location along the z-axis and a precession frequency for protons (hydrogen nuclei) that are that are located in an aqueous environment. A straight line 50 shows a correlation between a location along the z-axis and a precession frequency for protons (hydrogen nuclei) that are located in fat. Due to the chemical shift, the straight line 50 is shifted to lower frequencies relative to the straight line 51.

The radio-frequency excitation pulse with a spectrum between the frequencies f1 an f2 excites fat protons given such a gradient field in the partial region 33 that extends from $z_{F5}$ to $z_{F6}$. It is to be heeded that $z_{F5}$ corresponds to the coordinate $z_{W1}$ from FIG. 3 and $z_{F6}$ corresponds to the coordinate $z_{W2}$ from FIG. 3. Water protons are excited in the partial region 36. The regions for a fat excitation and for a water excitation are thus precisely exchanged relative to the excitation as explained in connection with FIG. 3.

The following acquisition phase does not differ from the acquisition phase after the first excitation pulse. A three-dimensional image is generated, wherein only fat protons contribute to the imaging in the partial region 33 and only water protons contribute to the imaging in the partial region 36.

In another variant, for a second acquisition the gradient field can remain unchanged but the radio-frequency excitation pulse is frequency-offset. The effect of such a frequency offset is clear in consideration of FIG. 3. A lower frequency of the excitation pulse should be f2 and a higher frequency f3 (not shown in FIG. 3) should be offset by the bandwidth $\Delta f1$ relative to f2. In the partial region 36, water protons are then excited and not fat protons.

In this case, a simultaneous excitation of fat protons in the partial region 33 does not take place. In a partial region situated to the right of partial region 36 in FIG. 3, fat protons are excited by the frequency-offset excitation pulse. Such a partial region lies outside of the slab 30. In order to generate a fat proton image of the entire examination volume 30, in a third pass a frequency offset by $\Delta f1$ to lower frequencies (i.e. with a higher frequency f1) must take place.

Figure 6:
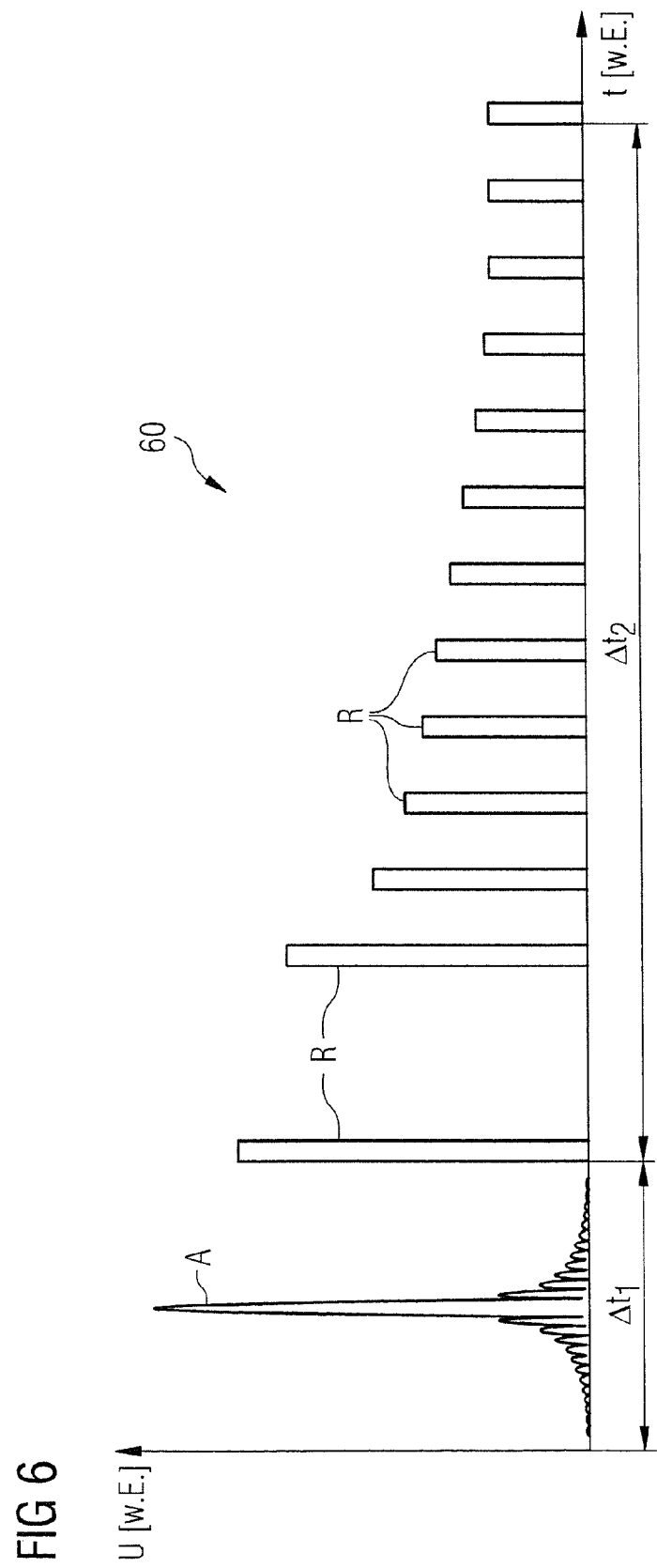
FIG. 6 schematically shows a pulse sequence for use in accordance with the present invention.

A pulse sequence according to the method according to the invention is shown purely schematically in a diagram 60 in FIG. 6. A voltage U is shown over time t, both in arbitrary units. The representation is not true to scale. In the excitation phase, an excitation pulse A is executed during a time period $\Delta t1$. In the subsequent acquisition phase, refocusing pulses R are executed in the time period $\Delta t2$. The present invention engages the design of the excitation pulse; the refocusing pulse can be determined as in a conventional acquisition.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance system comprising a data acquisition scanner comprising a radio-frequency (RF) radiator and a gradient system, said method comprising:

from a control computer, operating said data acquisition scanner according to a pulse sequence;

in said pulse sequence, generating a gradient, with said gradient system, in a gradient direction, as a spatially dependent magnetic field;

while said gradient is generated, radiating a selective RF excitation pulse with said RF transmission system, said selective RF excitation pulse being configured to excite nuclear spins of a first material in a first partial region of an examination subject and not to excite nuclear spins of a second material in said first partial region, and to not excite nuclear spins of said first material in a second partial region of the examination subject and to excite nuclear spins of said second material in said second partial region;

in said pulse sequence, radiating a number of refocusing pulses and acquiring raw magnetic resonance data from said first and second partial regions resulting from excitation of said nuclear spins of said first material and excitation of said nuclear spins of said second material, and spatially coding said raw magnetic resonance data along said gradient direction; and storing said raw magnetic resonance data in electronic form in a memory and making said raw magnetic resonance data stored in said memory available in said electronic form for further processing.

2. A method as claimed in claim 1 comprising radiating at least one of said refocusing pulses as a non-selective refocusing pulse.

3. A method as claimed in claim 1 comprising acquiring said raw magnetic resonance data with three-dimensional spatial coding.

4. A method as claimed in claim 3 comprising executing said three-dimensional spatial coding as phase coding in a first direction of a Cartesian coordinate system, and in a second direction of said Cartesian coordinate system, and as frequency coding in a third direction of said Cartesian coordinate system.

5. A method as claimed in claim 4 comprising executing said phase coding along said gradient direction.

6. A method as claimed in claim 1 comprising adjusting said spatially dependent magnetic field with said gradient to cause a resonance frequency of the nuclear spins of the first material in the first partial region to be between a first frequency and a second frequency and to cause a resonant frequency of the nuclear spins of the second material in the second partial region to be between said first frequency and said second frequency.

7. A method as claimed in claim 6 comprising radiating said selective RF excitation pulse with a frequency spectrum between said first frequency and said second frequency.

8. A method as claimed in claim 1 wherein said pulse sequence is a first pulse sequence and wherein said gradient is a first gradient, and comprising operating said data acquisition scanner from said control computer with a second pulse sequence in which a second gradient is generated to generate a spatially dependent magnetic field that differs from the spatially dependent magnetic field generated by said first gradient in terms of algebraic sign, and also radiating a selective RF excitation pulse in said second pulse sequence during said second gradient.

9. A method as claimed in claim 8 comprising radiating said selective RF excitation pulse in said second pulse sequence with a frequency offset with respect to the selective RF excitation pulse in said first pulse sequence.

10. A control device computer for operating a magnetic resonance system comprising a data acquisition scanner comprising a radio-frequency (RF) radiator and a gradient system, said control computer comprising:

a processor configured to operate said data acquisition scanner according to a pulse sequence;

said processor being configured, in said pulse sequence, to cause a gradient to be generated with said gradient system, in a gradient direction, as a spatially dependent magnetic field;

said processor being configured to cause, while said gradient is generated, a selective RF excitation pulse to be radiated with said RF transmission system, said selective RF excitation pulse being configured to excite nuclear spins of a first material in a first partial region of an examination subject and not to excite nuclear spins of a second material in said first partial region, and to not excite nuclear spins of said first material in a second partial region of the examination subject and to excite nuclear spins of said second material in said second partial region;

said processor being configured to operate said data acquisition scanner in said pulse sequence to radiate a number of refocusing pulses and acquire raw magnetic resonance data from said first and second partial regions resulting from excitation of said nuclear spins of said first material and excitation of said nuclear spins of said second material, and spatially coding said raw magnetic resonance data along said gradient direction; and said processor being configured to store said raw magnetic resonance data in electronic form in a memory and make said raw magnetic resonance data stored in said memory available in said electronic form for further processing.

11. A magnetic resonance system comprising:

a data acquisition scanner comprising a radio-frequency (RF) transmission system, and a gradient system;

a control computer configured to operate said data acquisition unit according to a pulse sequence;

said control computer being configured to cause, in said pulse sequence, a gradient to be generated with said gradient system, in a gradient direction, as a spatially dependent magnetic field;

said control computer being configured to cause, while said gradient is generated, a selective RF excitation pulse to be radiated with said RF transmission system, said selective RF excitation pulse being configured to excite nuclear spins of a first material in a first partial region of an examination subject and not to excite nuclear spins of a second material in said first partial region, and to not excite nuclear spins of said first material in a second partial region of the examination subject and to excite nuclear spins of said second material in said second partial region;

said control computer being configured to operate said data acquisition scanner in said pulse sequence to radiate a number of refocusing pulses and acquire raw magnetic resonance data from said first and second partial regions resulting from excitation of said nuclear spins of said first material and excitation of said nuclear spins of said second material, and spatially coding said raw magnetic resonance data along said gradient direction; and said control computer being configured to store said raw magnetic resonance data in electronic form in a memory and make said raw magnetic resonance data stored in said memory available in said electronic form for further processing.

12. A non-transitory, computer-readable data storage medium encoded with programming instructions, said storage medium being loaded into a control computer of a magnetic resonance system that also comprises a data acquisition scanner comprising a radio-frequency (RF) transmission system and a gradient system, said programming instructions causing said control computer to operate said data acquisition scanner to:

execute a magnetic resonance data acquisition pulse sequence;

in said pulse sequence, generate a gradient, with said gradient system, in a gradient direction, as a spatially dependent magnetic field;

while said gradient is generated, radiate a selective RF excitation pulse with said RF transmission system, said selective RF excitation pulse being configured to excite nuclear spins of a first material in a first partial region of an examination subject and not to excite nuclear spins of a second material in said first partial region, and to not excite nuclear spins of said first material in a second partial region of the examination subject and to excite nuclear spins of said second material in said second partial region;

in said pulse sequence, radiate a number of refocusing pulses and acquire raw magnetic resonance data from said first and second partial regions resulting from excitation of said nuclear spins of said first material and excitation of said nuclear spins of said second material, and spatially code said raw magnetic resonance data along said gradient direction; and store said raw magnetic resonance data in electronic form in a memory and make said raw magnetic resonance data stored in said memory available in said electronic form for further processing.

\* \* \* \* \*